United States Patent
Lo et al.

(10) Patent No.: US 10,930,527 B2
(45) Date of Patent: Feb. 23, 2021

(54) METHOD FOR CONTROLLING TEMPERATURE OF FURNACE IN SEMICONDUCTOR FABRICATION PROCESS

(71) Applicant: Taiwan Semiconductor Manufacturing Co., Ltd., Hsinchu (TW)

(72) Inventors: Jian-Lun Lo, Taichung (TW); Jih-Churng Twu, Hsinchu County (TW); Feng-Yu Chen, Taichung (TW); Yuan-Hsiao Su, Taitung (TW); Yi-Chi Huang, Taichung (TW); Yueh-Ting Yang, Taichung (TW); Shu-Han Chao, Taipei (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

(21) Appl. No.: 16/899,803

(22) Filed: Jun. 12, 2020

(65) Prior Publication Data

US 2020/0312685 A1    Oct. 1, 2020

Related U.S. Application Data

(63) Continuation of application No. 15/906,152, filed on Feb. 27, 2018, now Pat. No. 10,741,426.

(Continued)

(51) Int. Cl.
*H01L 21/67*    (2006.01)
*C23C 16/52*    (2006.01)
(Continued)

(52) U.S. Cl.
CPC ........ *H01L 21/67109* (2013.01); *C23C 16/46* (2013.01); *C23C 16/52* (2013.01);
(Continued)

(58) Field of Classification Search
CPC ......... H01L 21/67109; H01L 21/67248; H01L 21/67098; C23C 16/52; C23C 16/441; C23C 16/46
See application file for complete search history.

(56) References Cited

U.S. PATENT DOCUMENTS 5,387,557 A * 2/1995 Takagi ................. C23C 16/46
  438/758
5,616,264 A * 4/1997 Nishi .................... C23C 16/46
  219/483

(Continued)

*Primary Examiner* — Errol V Fernandes
*Assistant Examiner* — Jeremy J Joy
(74) *Attorney, Agent, or Firm* — McClure, Qualey & Rodack, LLP

(57) ABSTRACT

A method for processing semiconductor wafers in a furnace is provided. The method includes forming a thin film on each of the semiconductor wafers in a furnace. The furnace includes a first end thermal zone, a middle thermal zone and a second end thermal zone arranged in sequence. The method further includes controlling the temperature of the furnace in a first thermal mode during the formation of the thin film. The method also includes supplying a purging gas into the furnace after the formation of the thin film. In addition, the method includes controlling the temperature of the furnace in a second thermal mode during the supply of the purging gas. The temperature distributions of the furnace are different in the first and second thermal modes.

20 Claims, 11 Drawing Sheets

Related U.S. Application Data

(60) Provisional application No. 62/563,800, filed on Sep. 27, 2017.

(51) Int. Cl.
   *C23C 16/46* (2006.01)
   *H01L 21/02* (2006.01)

(52) U.S. Cl.
   CPC .... *H01L 21/0217* (2013.01); *H01L 21/02164* (2013.01); *H01L 21/02211* (2013.01); *H01L 21/02271* (2013.01); *H01L 21/67248* (2013.01)

(56) References Cited

U.S. PATENT DOCUMENTS

| | | | | |
|---|---|---|---|---|
| 5,900,177 | A * | 5/1999 | Lecouras | C30B 25/10 219/497 |
| 6,306,764 | B1 * | 10/2001 | Kato | H01L 21/67109 438/660 |
| 10,186,429 | B2 * | 1/2019 | Takenaga | H01L 21/67109 |
| 2002/0001788 | A1 * | 1/2002 | Sakamoto | H01L 21/67781 432/24 |
| 2002/0014483 | A1 * | 2/2002 | Suzuki | H01L 21/67248 219/486 |
| 2002/0045146 | A1 * | 4/2002 | Wang | C30B 31/18 432/49 |
| 2002/0127828 | A1 * | 9/2002 | Suzuki | C23C 16/463 438/488 |
| 2004/0157183 | A1 * | 8/2004 | Bernhardt | C30B 33/005 432/205 |
| 2004/0173599 | A1 * | 9/2004 | Velichko | H01L 21/67248 219/494 |
| 2005/0201894 | A1 * | 9/2005 | Suzuki | H01L 21/31662 427/255.28 |
| 2007/0239375 | A1 * | 10/2007 | Kaushal | G05B 23/0254 702/81 |
| 2009/0110824 | A1 * | 4/2009 | Takenaga | C23C 16/481 427/248.1 |
| 2010/0144161 | A1 * | 6/2010 | Nakamura | H01L 21/67109 438/767 |
| 2010/0240224 | A1 * | 9/2010 | Wu | F27B 17/0025 438/765 |
| 2017/0278699 | A1 * | 9/2017 | Kasai | C23C 16/52 |

* cited by examiner

METHOD FOR CONTROLLING TEMPERATURE OF FURNACE IN SEMICONDUCTOR FABRICATION PROCESS

PRIORITY CLAIM AND CROSS-REFERENCE

This application is a Continuation of application Ser. No. 15/906,152, filed on Feb. 27, 2018, now U.S. Pat. No. 10,741,426, which claims the benefit of U.S. Provisional Application No. 62/563,800, filed on Sep. 27, 2017, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon and form integrated circuits. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

Some processing steps used in fabricating semiconductors include oxidation, diffusion, doping, annealing, and chemical vapor deposition (CVD). These processes are typically performed at elevated the temperatures within heated controlled environments. CVD is a reactive process used to produce or deposit thin films of material on the wafer including, but not limited to, metals, silicon dioxide, tungsten, silicon nitride, silicon oxynitride, and various dielectrics. The uniformity of the film deposited on the wafer by CVD is affected and controlled by regulating process parameters such the temperature of the wafer, reaction chamber pressure, flow path and rate of reactant gases, and process time or duration.

Although existing devices and methods for producing or depositing thin films of material on the wafer have been generally adequate for their intended purposes, they have not been entirely satisfactory in all respects. Consequently, it would be desirable to provide a solution for forming the thin films for use in a wafer processing apparatus.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
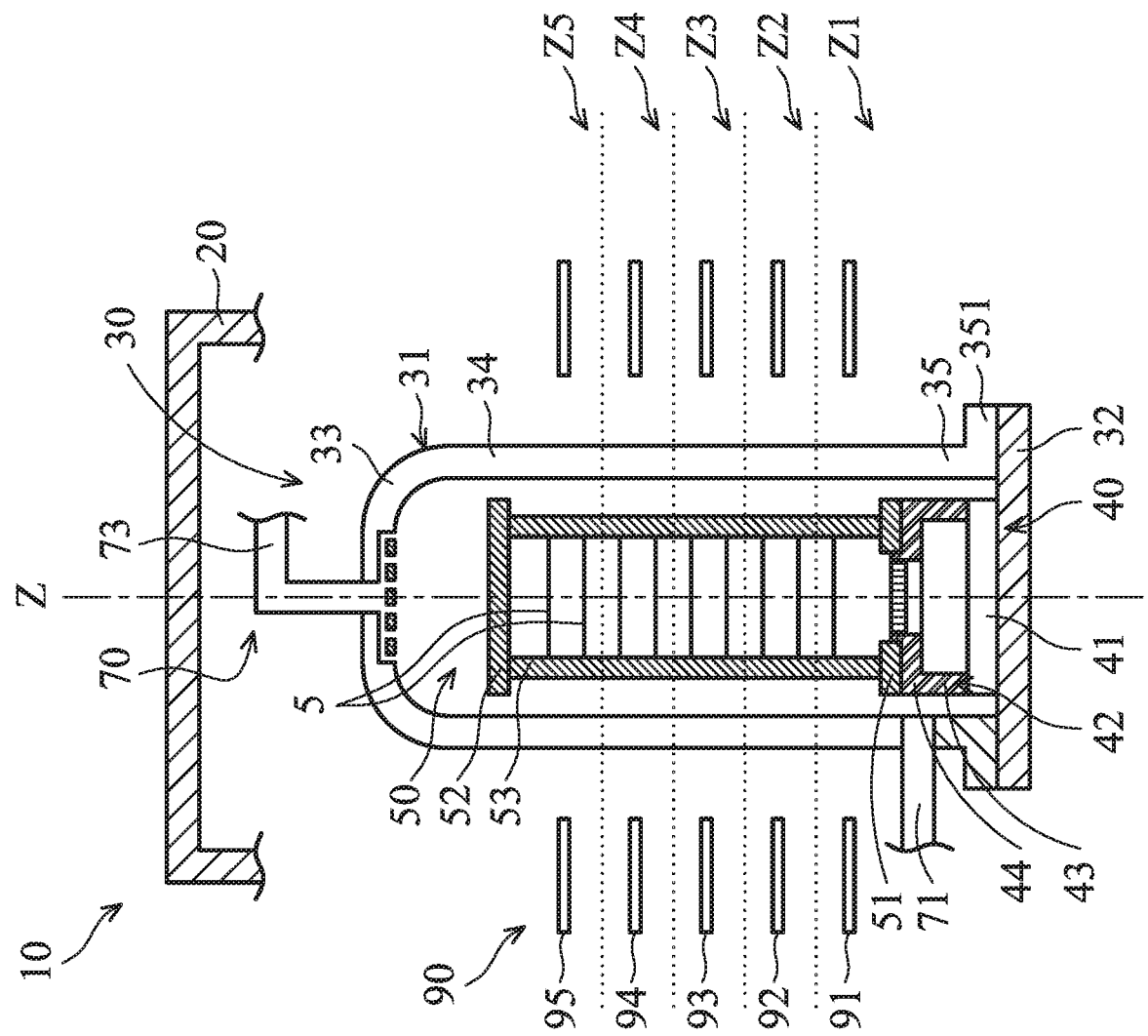
FIG. 1 shows a schematic diagram of one embodiment of a furnace for processing a semiconductor wafers, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 shows a schematic diagram of one embodiment of a furnace 10 for processing semiconductor wafers 5 in accordance with some embodiments. In some embodiments, the furnace 10 includes an insulated housing 20 (partially shown in FIG. 1), a reaction chamber 30, an insulation cap 40, a wafer boat 50, a gas supplying unit 70 and a heating assembly 90. Additional features can be added to the furnace 10. Some of the features described below can be replaced or eliminated for additional embodiments of the furnace 10.

In accordance with some embodiments, the insulated housing 20 is configured and adapted to provide a thermal enclosure around the reaction chamber 30 to establish a temperature controlled environment for the reaction chamber 30. The reaction chamber 30 includes a tube 31 and a sealing lid 32. The tube 31 extends a height in its longitudinal axis Z and has a top side 33, a sidewall 34, and a bottom side 35.

The top side 33 is closed, and the bottom side 35 is open to allow the wafer boat 50 to be inserted into and removed from the reaction chamber 30 for batch processing of the semiconductor wafers 5. The top side 33 and the bottom side 35 are located at two opposite sides of the tube 31 and arranged along the longitudinal axis Z. The side wall 34 connects the top side 33 to the bottom side 35. In one embodiment, the bottom side 35 may be provided with a flange 351 as shown in FIG. 1 for receiving the sealing lid 32.

The reaction chamber 30 may have a cylindrical shape in one embodiment and may be made of quartz or any other suitable material, like SiC for example, but without limitation. The reaction chamber 30 may include a coating such as polysilicon or another coating material typically used depending on the type of process conducted in the chamber. The reaction chamber 30 may have any suitable height or length depending on the number of wafers to be processed in each batch. In some exemplary embodiments, the reaction chamber 30 may have a representative vertical height or length of 100-150 cm.

The insulation cap 40 is configured to minimize the heat lost via the sealing lid 32. In some embodiments, the insulation cap 40 is positioned in a lower site of the reaction chamber 30 that is approximate to the bottom side 35 and includes a quartz base 41 and a supporting frame 42. The quartz base 41 may be fixed on the inner surface of the insulation cap 40 that faces the interior of the reaction chamber 30. The supporting frame 42 is positioned over the quartz base 41 for supporting the wafer boat 50.

In some embodiments, the supporting frame 42 includes a lateral frame member 43 and a top frame member 44. The lateral frame member 43 is fixed on the quartz base 41 and extends in a direction that is away from the sealing lid 32 and parallel to the longitudinal axis the tube 31. The top frame member 44 is connected to the distal end of the lateral frame member 43 and extends parallel to the sealing lid 32. The supporting frame 42 may be made of suitable material, like SiC or quartz for example, but without limitation. The lateral frame member 43 and the top frame member 44 may be fabricated integrally, and the lateral frame member 43 and the top frame member 44 may have the same thickness.

In some embodiments, the insulation cap 40 is replaced by a rotation stage (not shown in figures). The rotation stage is positioned on the sealing lid 32. In addition, a driving member, such as a motor, is connected to the stage. The driving member is arranged such that, in operation, the rotation stage is rotatable about at a rotation axis that is parallel to the longitudinal axis Z of the reaction chamber 30, and the wafer boat 50 positioned on the stage is rotated. Therefore, the uniformity of the thin film of processing material 7 in a deposition process is improved.

The wafer boat 50 is adapted for supporting and holding a plurality of vertically-stacked semiconductor wafers 5 and allowing reactant gas to flow horizontally over the face of the semiconductor wafers 5 to build the desired oxidation film thicknesses thereon. In some embodiments, the wafer boat 50 is positioned over the insulation cap 40 and includes a bottom plate 51, a top plate 52 and a number of columns 53.

The bottom plate 51 and the top plate 52 are arranged to face each other. The columns 53 connect the bottom plate 51 to the top plate 52. Each of the columns 53 has grooves (not shown) for directly holding the semiconductor wafers 5 to be placed in multiple stages or for holding ring-shaped support plates on which the semiconductor wafers 5 are to be placed in multiple stages.

Typical vertical spacing of semiconductor wafers 5 in wafer boat 50 may be about 6-10 mm apart in some embodiments. The wafer boat 50 may be sized to hold 50-125 semiconductor wafers 5 or more in some embodiments; however, any suitable number of wafers may be held by the wafer boat depending on the height of the reaction chamber 30 provided. The wafer boat 50 may be made of quartz, SiC, Si or any other suitable material commonly used in the art.

The wafer boat 50 may be fixed on the insulation cap 40 by any suitable method. For example, the wafer boat 50 may be fixed on the insulation cap 40 via fastening members, such as screws. The fastening members pass through the bottom plate 51 and the top frame member 44 to fix the bottom plate 51 to the top frame member 44; however, any suitable method for fastening may be used.

The gas supplying unit 70 is configured to control the supply of the processing gas into the reaction chamber 30. In some embodiments, the gas supplying unit 70 includes an inlet port 71 and an outlet port 73. The inlet port 71 is connected to the lower portion of the side wall 34 that is adjacent to the bottom side 35. The outlet port 73 is connected to the top side 33 of the reaction chamber 30. A controller (not shown in figures) may be connected to the inlet port 71 and be configured to control the connection and delivery rate of the processing material to the reaction chamber 30. The controller may include devices such as valves, flow meters, sensors, and the like.

The heating assembly 90 is arranged along the sidewall 34 of the reaction chamber 30. In some embodiments, the heating assembly 90 includes a number of sidewall heaters provided along the sidewall 34 of the reaction chamber 30 from the bottom side 35 to the top side 33. For example, the heating assembly 90 includes, but not limited to, five sidewall heaters 91, 92, 93, 94 and 95. It should be noted that the number of the sidewall heaters can be changed according to demands. In some other embodiments, the heating assembly 90 includes four sidewall heaters. In some embodiments, the sidewall heaters 91, 92, 93, 94 and 95 may be approximately evenly distributed along the vertical height of the reaction chamber.

In some embodiments, the sidewall heaters 91, 92, 93, 94 and 95 are electric resistance type heaters having controllable heat output which may be regulated by adjusting the energy input to each heater via an electrical control device. The heat output from sidewall heaters 91, 92, 93, 94 and 95 may be fine-tuned to adjust the temperature in respective heater zone. In some embodiments, the sidewall heaters 91, 92, 93, 94 and 95 preferably extend around the entire circumference of reaction chamber 30. The electric resistance coils are electrically coupled via conductors to an electrical power supply, which may be routed through suitable variable resistance electrical controls as typically used in the industry to allow the heat output (e.g. Btu/h) to be adjusted from each sidewall heater 91, 92, 93, 94 and 95.

In some embodiments, as shown in FIG. 1, there are five thermal zones Z1, Z2, Z3, Z4 and Z5 defined in the reaction chamber 30. The five thermal zones Z1, Z2, Z3, Z4 and Z5 are arranged along the longitudinal direction Z in sequence. Specifically, the thermal zone Z1 is arranged adjacent to the bottom side 35 of the tube 31 and is closer to the inlet port 71 than the other thermal zones Z2-Z4. The thermal zone Z5 is arranged adjacent to the top side 33 of the tube 31 and is closer to the outlet port 73 than the other thermal zone Z1-Z5. The thermal zone Z3 is located away from the thermal zone Z1 and the thermal zone Z5 and is arranged in the middle portion of the tube 31. The thermal zone Z2 is arranged between the thermal zone Z1 and the thermal zone Z3, and the thermal zone Z4 is arranged between the thermal zone Z3 and the thermal zone Z5.

In some embodiments, the five thermal zones Z1, Z2, Z3, Z4 and Z5 are arranged corresponding to the sidewall heaters 91, 92, 93, 94 and 95. The five thermal zones Z1, Z2, Z3, Z4 and Z5 may be approximately evenly distributed along the vertical height of the reaction chamber. The boundary line, as indicated by dotted lines shown in FIG. 1, of the two neighboring thermal zones Z1, Z2, Z3, Z4 and Z5 may pass through a center of two neighboring sidewall heaters 91, 92, 93, 94 and 95. Therefore, temperatures in the thermal zones Z1, Z2, Z3, Z4 and Z5 are dominated by the corresponding sidewall heaters 91, 92, 93, 94 and 95.

In this case, the temperature in each of the thermal zones Z1, Z2, Z3, Z4 and Z5 is referred to as a mean value of temperature measured in each of the thermal zones Z1, Z2, Z3, Z4 and Z5. The temperature in each of the thermal zones Z1, Z2, Z3, Z4 and Z5 may be slightly lower or higher than the heat output from the sidewall heaters 91, 92, 93, 94 and 95 due to heat loss and other factories. For example, the temperature in the thermal zone Z1 may be lower than the actual temperature of the sidewall heater 91 because heat may be lost via the open end of the tube 31 even though the sealing lid 32 is closed.

In some embodiments, some of the thermal zones have more than one sidewall heaters, and some of the thermal zones have no side wall heaters. For example, in tube having smaller dimensions, such as tube for processing 50 wafers, the thermal zone Z1 includes two sidewall heaters 91 and 92, and the thermal zone Z3 includes one sidewall heater 93, and the thermal zone Z5 includes two sidewall heaters 94 and 95. There is no other sidewall heater positioned in the thermal zones Z2 and Z4. The temperature in the thermal zones Z2 and Z4 are adjusted by the sidewall heaters positioned in the neighboring thermal zones.

In some embodiments, there are the same number of slots of the wafer boat 50 being positioned in each of the thermal zones Z1, Z2, Z3, Z4 and Z5. For example, in each of the thermal zones Z1, Z2, Z3, Z4 and Z5, there are twenty slots for receiving the corresponding number of semiconductor wafers 5. However, any suitable number of slots may be located in each of the thermal zones Z1, Z2, Z3, Z4 and Z5.

It should be appreciated that the number of sidewall heaters that are furnished may be selected such that each sidewall heater controls temperature for less than or equal to no more than twenty vertically-stacked semiconductor wafers 5 per heater to provide better temperature uniformity and corresponding uniformity in wafer level thicknesses both on each wafer 5 (e.g. from center of wafer to edges thereof) and from wafer-to-wafer in the vertical stack of semiconductor wafers 5 supported by the wafer boat 50. In these cases, the number of thermal zones in the reaction chamber 30 corresponds to the number of sidewall heaters disposed in the furnace 10.

For purpose of clarity, in the following descriptions of method 60, thermal zone Z1 is referred to as a "first end thermal zone"; thermal zone Z2 is referred to as a "first intermediate thermal zone"; thermal zone Z3 is referred to as a "middle thermal zone"; thermal zone Z4 is referred to as a "second intermediate thermal zone"; and thermal zone Z5 is referred to as a "second end thermal zone".

It should be noted that since the number of thermal zones in the reaction chamber 30 corresponds to the number of sidewall heaters. The definition of the middle thermal zone may change according to the numbers of the sidewall heaters. In the cases where there are odd numbers of thermal zones, the thermal zone which is located in a middle position between two end thermal zones is referred to as a "middle thermal zone". In the cases where there are even numbers of thermal zones, such as four, the two thermal zones that are located immediately adjacent to a middle position between two end thermal zones are cooperatively referred to as a "middle thermal zone".

Figure 2:
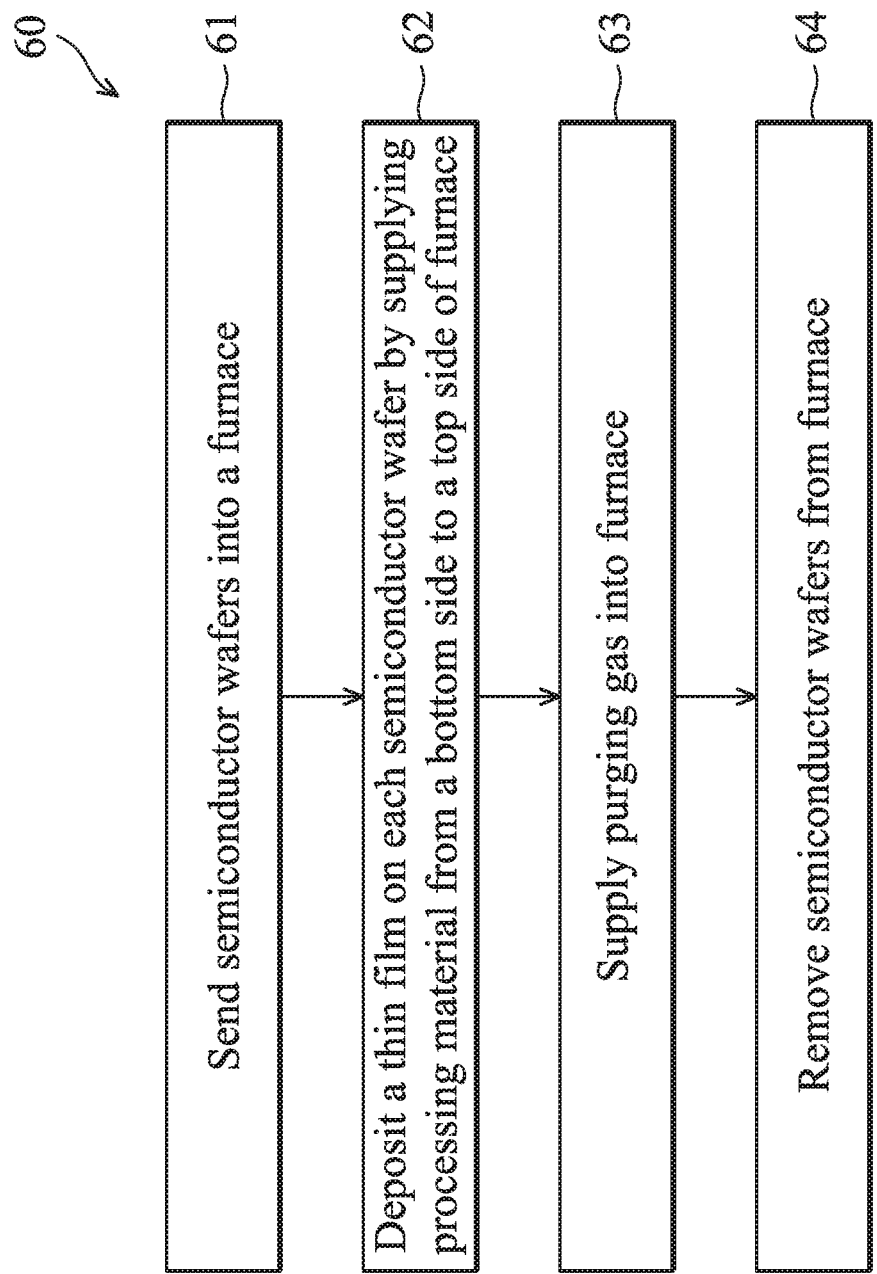
FIG. 2 is a flow chart illustrating a method for processing semiconductor wafers in a furnace, in accordance with some embodiments.

FIG. 2 is a flow chart illustrating a method 60 for processing semiconductor wafers 5 in the furnace 10, in accordance with some embodiments. For illustration, the flow chart will be described along with the drawings shown in FIGS. 1 and 3-5. Additional operations can be provided before, during, and after the method 60, and some of the operations described can be replaced or eliminated for other embodiments of the method.

The method 60 begins with operation 61, in which semiconductor wafers 5 are sent into the reaction chamber 30 of the furnace 10. In some embodiments, to load the semiconductor wafers 5 into the wafer boat 50, the sealing lid 32 is separated from the tube 31 and the insulation cap 40 by means of the lifting mechanism (not shown in figures), and the wafer boat 50 are moved outside the cavity defined by the tube 31. The semiconductor wafers 5 may be moved into the wafer boat 50 by a robot arm (not shown in figures) with a blade.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

After the semiconductor wafers 5 are loaded to the wafer boat 50, the wafer boat 50 is inserted into the reaction chamber 30. The wafer boat 50 may be loaded in the tube 31 by lifting up the sealing lid 32 by means of the lifting mechanism (not shown in figures). When the sealing lid 32 is connected to the bottom side 35 of the tube 31, the wafer boat 50 is located in a gas-tight reaction chamber 30.

The method 60 continues with operation 62, a thin film of processing material is formed on the semiconductor wafers 5. In some embodiments, the processing material 7 is supplied into the furnace 10 for depositing a thin film 700 of the processing material 7 on each semiconductor wafer 5, as shown in FIGS. 3A and 3B.

Figure 3A:
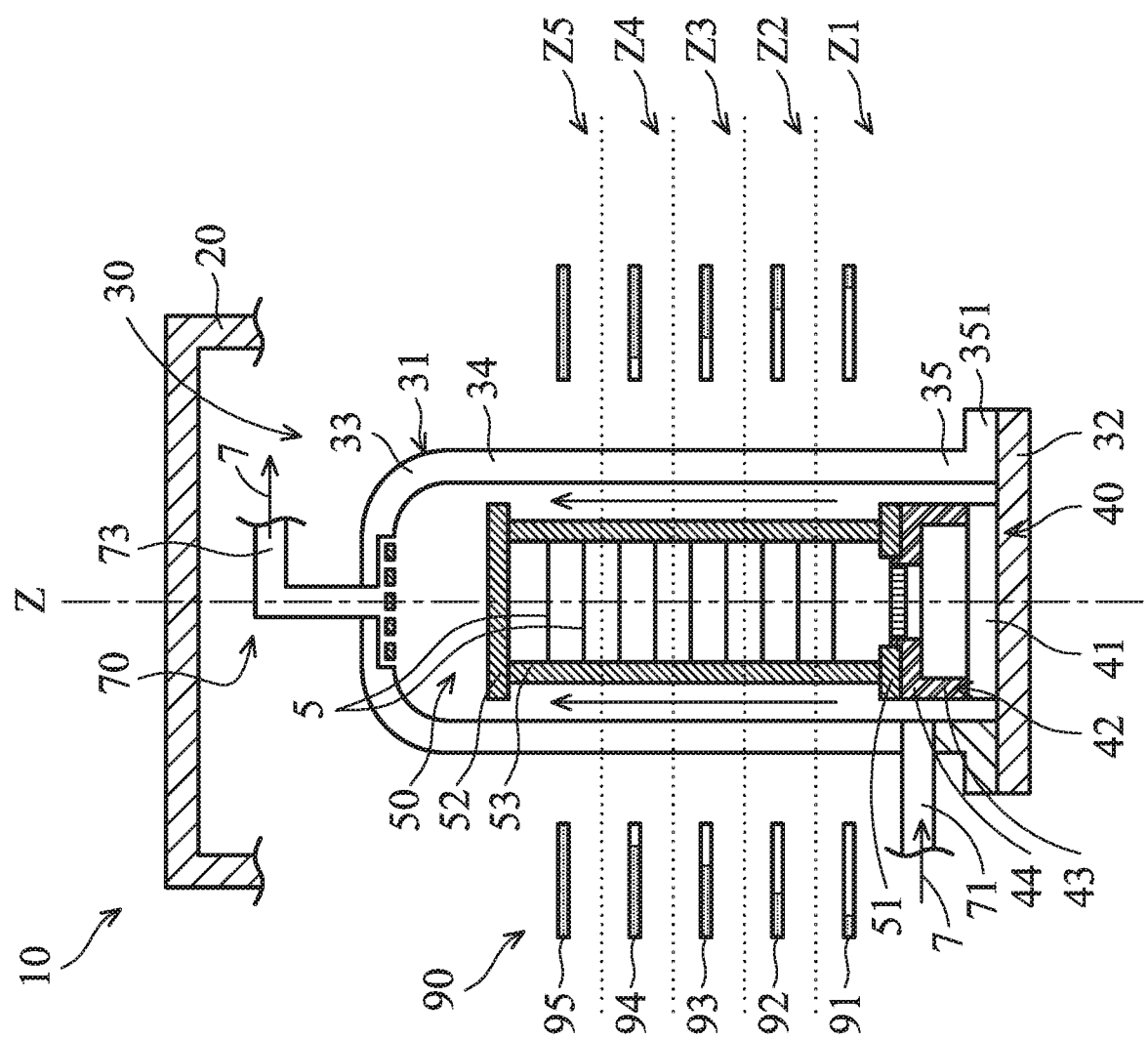
FIG. 3A shows a schematic view of a stage of a method for supplying processing material into a reaction chamber in which heat output from sidewall heaters are gradually increased from a bottom side to a top side of the reaction chamber, in accordance with some embodiments.
Figure 3B:
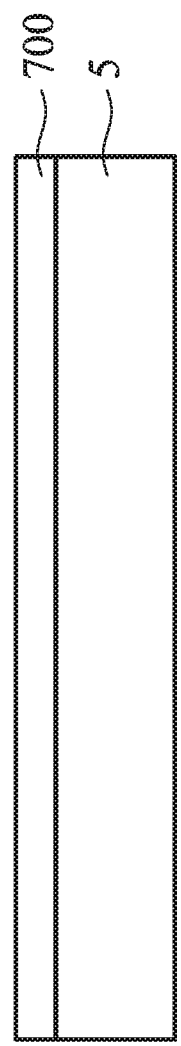
FIG. 3B shows a schematic view of a semiconductor wafer covered with a thin film, in accordance with some embodiments

The processing material 7 flows from bottom side 35 to the top side 33 of the reaction chamber 30, as indicated by arrows shown in FIG. 3A. Specifically, the processing material 7 enters the reaction chamber 30 via the inlet port 71 and passes through the first end thermal zone Z1, the first intermediate thermal zone Z2, the middle thermal zone Z3, the second intermediate thermal zone Z4, the second end thermal zone Z5 in sequence, and is exhausted via the outlet port 73. The processing material 7 may contain various chemical precursors (e.g. $SiH_2Cl_2$ and $NH_3$ or silane and $NH_3$ to form a silicon nitride film; $Si(OC_2H_5)_4$ to form a TEOS film; and dry oxygen, water vapor or Trans-LC ($C_2H_2Cl_2$) to form oxide layer) that react at the heated semiconductor wafer surface to form a thin film of the desired semiconductor material and thickness thereon.

In some embodiments, operation 62 is performed at an elevated temperature within heated controlled environments by controlling heat output from the sidewall heaters 91-95 so as to enable the first end thermal zone Z1, the first intermediate thermal zone Z2, the middle thermal zone Z3, the second intermediate thermal zone Z4 and the second end thermal zone Z5 to have their predetermined temperatures.

The heat output from each of the sidewall heaters 91, 92, 93, 94 and 95 is adjustable independent of the other sidewall heaters. The heat output setting of each sidewall heater may be adjusted either manually by a user or controlled automatically via a heater controller or computer in conjunction with control signals generated by the temperature sensors disposed in the furnace 10 and/or based on predetermined heater the temperature output settings derived from experience and empirical data correlated with the size of wafer being processed. A suitable temperature controller may be used to regulate the heat output from the furnace heating assembly including the temperature ramp up and ramp down rates.

In some embodiments, the sidewall heaters 91, 92, 93, 94 and 95 are controlled in a first thermal mode in which the heat output from the sidewall heaters 91, 92, 93, 94 and 95 are gradually increased, and as such, temperatures in the first end thermal zone Z1, the first intermediate thermal zone Z2, the middle thermal zone Z3, the second intermediate thermal zone Z4 and the second end thermal zone Z5 are gradually increased. As a result, semiconductor wafers 5 positioned closer to the top side 33 are processed at a higher temperature than the semiconductor wafers 5 positioned closer to the bottom side 35.

For example, as shown in FIG. 3A, heat output from the sidewall heaters 91, 92, 93, 94 and 95 are gradually increased in a direction away from the bottom side 35 (the larger colored area in the blocks which are designated as the sidewall heaters 91-95 indicates higher heat output from the corresponding sidewall heaters 91-95). Therefore, temperatures in the first end thermal zone Z1, the first intermediate thermal zone Z2, the middle thermal zone Z3, the second intermediate thermal zone Z4 and the second end thermal zone Z5 are gradually increased in a direction away from the bottom side 35.

In some embodiments, due to the fact that wafer film thickness deposition rates are directly proportional to the processing temperature, the predetermined temperatures for thin film deposition process in the first end thermal zone Z1, the first intermediate thermal zone Z2, the middle thermal zone Z3, the second intermediate thermal zone Z4 and the second end thermal zone Z5 are controlled based on the concentration of the processing material 7 in the corresponding thermal zone.

Therefore, by heating semiconductor wafers 5 in the first thermal mode during operation 62, an inconsistency in film thicknesses from wafer-to-wafer throughout the entire batch or stack of wafers due to a decrease of the concentration of the processing material 7 along a flow direction (from bottom side 35 to top side 33 in the case shown in FIG. 3A) can be mitigated or avoided.

In some embodiments, the first end thermal zone Z1, the first intermediate thermal zone Z2, the middle thermal zone Z3, the second intermediate thermal zone Z4 and the second end thermal zone Z5 are heated to have their predetermined temperatures before the supply of the processing material 7. For example, as shown in FIG. 4, the first end thermal zone Z1 and the second end thermal zone Z5 are respectively heated to an elevated temperature T11 and an elevated temperature T51 before the completion of operation 61 of wafer loading.

Figure 4:
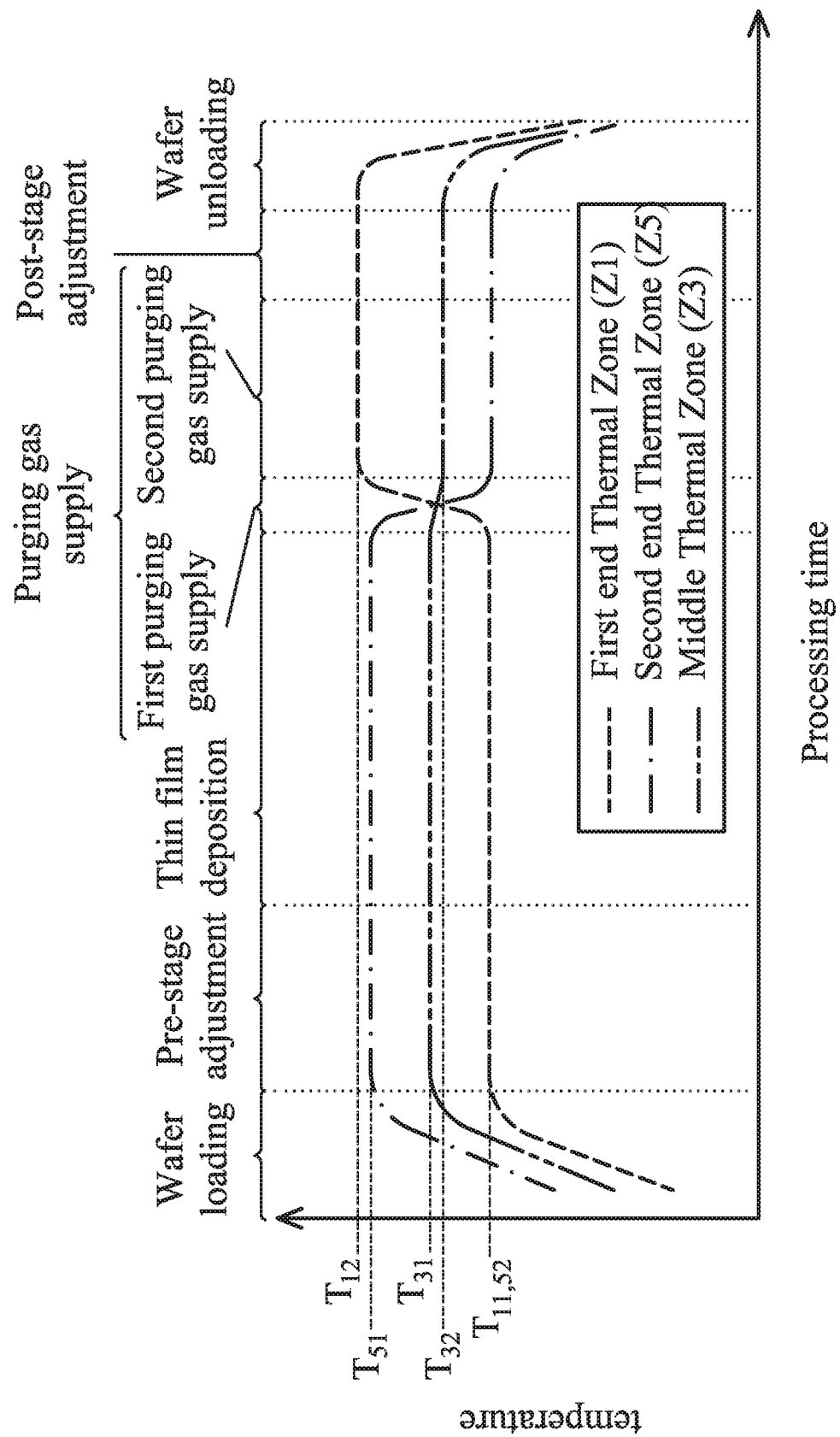
FIG. 4 shows a graph of temperature in the different thermal zones of a furnace versus time in a process for processing semiconductor wafers, in accordance with some embodiments.

In some embodiments, a pre-stage adjustment process is further executed before operation 63 and after operation 61, as shown in FIG. 4. In the pre-stage adjustment process, the thermal zones Z1-Z5 of the reaction chamber 30 are continuously heated so as to allow the heat to be evenly spread in each of the thermal zones. In addition, in the pre-stage adjustment process, the pressure in the reaction chamber 30 is adjusted to a processing pressure at which the deposition process is conducted.

In some embodiments, the difference in heat output between the neighboring heaters may be within 5 degrees Celsius. Therefore, in the cases shown in FIG. 3A, the temperature difference between the first end thermal zone Z1 and the second end thermal zone Z5 is within twenty (20) degrees Celsius. However, it should be appreciated that many variations and modifications can be made to embodiments of the disclosure. In some other embodiments, temperatures in the thermal zones Z1 and Z2 are the same, and temperature in the thermal zones Z3 is higher than temperatures in the thermal zones Z1 and Z2. In addition, temperatures in the thermal zones Z4 and Z5 are the same and higher than temperature in the thermal zones Z3. The temperature difference between the first end thermal zone Z1 and the second end thermal zone Z5 is within twenty (20) degrees Celsius.

Figure 5:
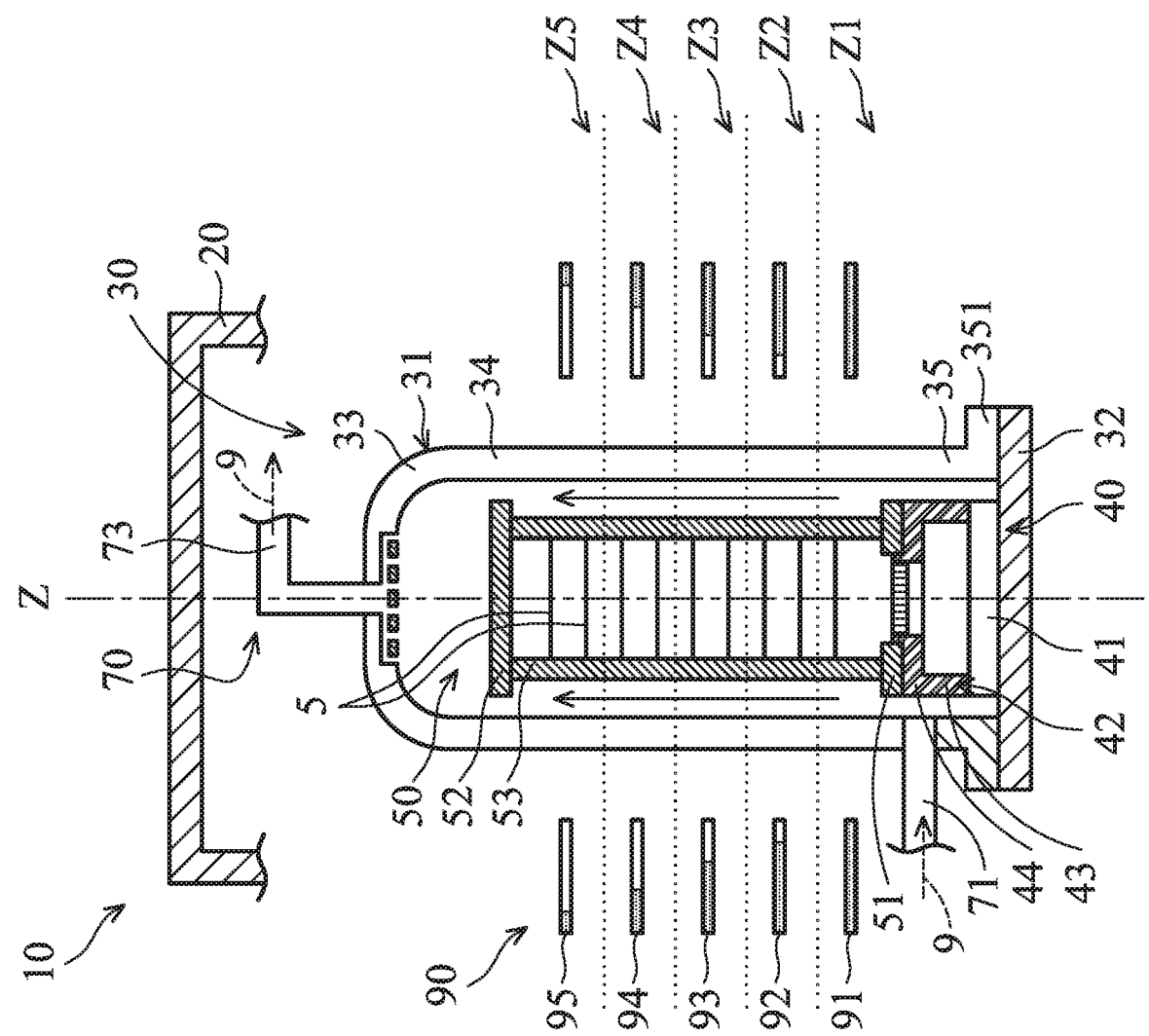
FIG. 5 shows a schematic view of a stage of a method for supplying purging gas into a reaction chamber in which heat output from sidewall heaters are gradually decreased from a bottom side to a top side of the reaction chamber, in accordance with some embodiments.

The method 60 continues with operation 63, in which one or more purging gases 9 are supplied into the furnace 10. In some embodiments, operation 63 is executed after the completion of operation 62 so as to remove the processing material 7 that remains in the reaction chamber 30. In some embodiments, as shown in FIG. 5, operation 63 for supplying purging gas 9 includes supplying a first purging gas into the reaction chamber 30. In addition, operation 63 further includes supplying a second purging gas into the reaction chamber 30. The first purging gas may react with the processing material 7 that remains in the reaction chamber 30, and the second purging gas may remove all the remaining gases including product gas produced during the operation 62. For example, in cases where a silicon nitride film is formed on the semiconductor wafers 5, the first purging gas may include $NH_3$, and the second purging gas may include $N_2$.

In some embodiments, the time period for supplying the first purging gas may be less than the time period for supplying the second purging gas. However, it should be appreciated that many variations and modifications can be made to embodiments of the disclosure. The time period for supplying the first purging gas may be equal to or longer than the time period for supplying the second purging gas.

The method 60 continues with operation 64, in which the semiconductor wafers 5 are unloaded. In some embodiments, to unload the semiconductor wafers 5 from the wafer boat 50, the sealing lid 32 is separated from the tube 31 and the insulation cap 40 and the wafer boat 50 are moved outside the cavity defined by the tube 31. The semiconductor wafers 5 may be removed from the wafer boat 50 by a robot arm (not shown in figures) with a blade.

Operation 64 may be executed after the completion of operation 63. In some embodiments, as shown in FIG. 4, before operation 64 is initiated, the method 60 further includes a post-stage adjustment process. In post-stage adjustment process, the pressure in the reaction chamber 30 may be increased from a vacuum to an ambient pressure.

In some embodiments, after the completion of operation 62 (or during operation 63), heat output from the sidewall heaters 91-95 are changed so as to enable the first end thermal zone Z1, the first intermediate thermal zone Z2, the middle thermal zone Z3, the second intermediate thermal zone Z4 and the second end thermal zone Z5 to have different temperatures from that in operation 62.

In some embodiments, the sidewall heaters 91, 92, 93, 94 and 95 are controlled in a second thermal mode in which the heat output from the sidewall heaters 91, 92, 93, 94 and 95 are gradually decreased, and as such, temperatures in the first end thermal zone Z1, the first intermediate thermal zone Z2, the middle thermal zone Z3, the second intermediate thermal zone Z4 and the second end thermal zone Z5 are gradually decreased. As a result, semiconductor wafers 5 positioned closer to the top side 33 are processed at a lower temperature than the semiconductor wafers 5 positioned closer to the bottom side 35.

For example, as shown in FIG. 5, heat output from the sidewall heaters 91, 92, 93, 94 and 95 are gradually decreased in a direction away from the bottom side 35. Therefore, temperatures in the first end thermal zone Z1, the first intermediate thermal zone Z2, the middle thermal zone Z3, the second intermediate thermal zone Z4 and the second end thermal zone Z5 are gradually decreased in a direction away from the bottom side 35.

Heating semiconductor wafers 5 in the second thermal mode after operation 62 can mitigate or avoid problems that the thin films of processing material 7 display different physical properties in the following processing steps (such as a different etch rate in the etching process) due to the temperature variance during operation 62. Accordingly, variations in critical dimension (CD) from wafer-to-wafer after the etching process are minimized. According to experimental results, critical dimension of semiconductor wafers 5 in the first end thermal zone Z1 and the second end thermal zone Z5 are improved 0.3%.

In some embodiments, temperatures in the first end thermal zone Z1, the first intermediate thermal zone Z2, the middle thermal zone Z3, the second intermediate thermal zone Z4 and the second end thermal zone Z5 are changed slowly to prevent thermal stress from being produced in the thin film. In some embodiments, the first end thermal zone Z1, the first intermediate thermal zone Z2, the middle thermal zone Z3, the second intermediate thermal zone Z4 and the second end thermal zone Z5 are heated to have temperatures associated with the second thermal mode within about 4 to 5 minutes.

However, it should be appreciated that many variations and modifications can be made to embodiments of the disclosure. In some other embodiments, the adjustment of the temperatures in first end thermal zone Z1, the first intermediate thermal zone Z2, the middle thermal zone Z3, the second intermediate thermal zone Z4 and the second end thermal zone Z5 is simultaneously performed while the purging gas 9 is supplied into the furnace 10. The first end thermal zone Z1, the first intermediate thermal zone Z2, the middle thermal zone Z3, the second intermediate thermal zone Z4 and the second end thermal zone Z5 may be heated to have temperatures associated with the second thermal mode before the supply of the first purging gas is completed.

In some embodiments, as shown in FIG. 4, during the transition from the first thermal mode to the second thermal mode, the temperature in the second end thermal zone Z5 is decreased until the temperature in the second end thermal zone Z5 is adjusted to temperatures associated with the second thermal mode. In addition, the temperature in the first end thermal zone Z1 is increased until the temperature in the first end thermal zone Z1 is adjusted to temperatures associated with the second thermal mode.

In some embodiments, during the transition from the first thermal mode to the second thermal mode, the amount of the temperature increase in the first end thermal zone Z1 is different from the amount of the temperature reduction in the second end thermal zone Z5. For example, the temperature in the first end thermal zone Z1 in the first thermal mode is T11, and temperature in the first end thermal zone Z1 in the second thermal mode is T12. On the other hand, the temperature in the second end thermal zone Z5 in the first thermal mode is T51, and temperature in the second end thermal zone Z5 in the second thermal mode is T52. The temperature difference between T11 and T12 is greater than the temperature difference between T51 and T52. In one exemplary embodiment, temperatures T11 and T52 are about 570° C., temperature T51 is about 590° C., and temperature T12 is about 600° C.

In some embodiments, temperatures in the middle thermal zone Z3 are fixed at the same value in the first thermal mode and the second thermal mode. However, it should be appreciated that many variations and modifications can be made to embodiments of the disclosure. In some other embodiments, temperatures in the middle thermal zone Z3 in the first thermal mode and the second thermal mode are different.

In some embodiments, in both the first and second thermal modes, the temperature in the middle thermal zone Z3 is between the temperatures in the first end thermal zone Z1 and the second end thermal zone Z5. For example, as shown in FIG. 4, in the first thermal mode, the middle thermal zone Z3 is kept at a first temperature T31. The temperature T11 in the first end thermal zone Z1 is lower than the first temperature T31, and the temperature T51 in the second end thermal zone Z5 is higher than the first temperature T31. The first temperature T31 may be a mean value of the temperature T11 in the first end thermal zone Z1 and the temperatures T51 in the second end thermal zone Z5 in the first thermal mode.

In addition, in the second thermal mode, the middle thermal zone Z3 is kept at a second temperature T32, the temperature T12 in the first end thermal zone Z1 is higher than the second temperature T32, and the temperature T52 in the second end thermal zone Z5 is lower than the second temperature T32. The second temperature T32 may be a mean value of the temperature T12 in the first end thermal zone Z1 and the temperature T52 in the second end thermal zone Z5 in the second thermal mode.

In some embodiments, the temperature difference in the middle thermal zone Z3 between the first thermal mode and the second thermal mode is smaller than the temperature difference in the first end thermal zone Z1 between the first thermal mode and the second thermal mode. Alternatively, the temperature difference in the middle thermal zone Z3 between the first thermal mode and the second thermal mode is smaller than the temperature difference in the second end thermal zone Z5 between the first thermal mode and the second thermal mode.

Figure 6:
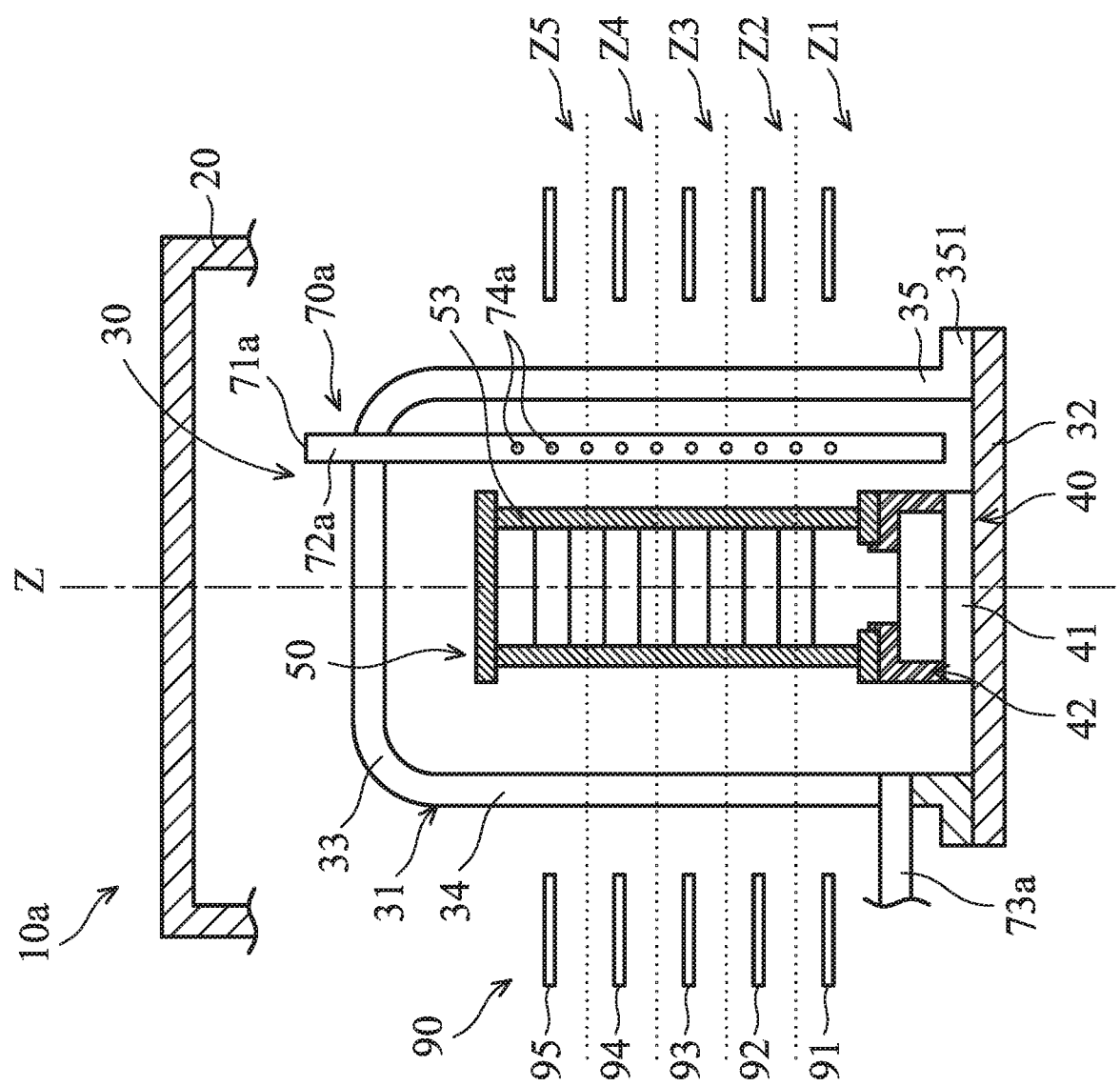
FIG. 6 shows a schematic diagram of one embodiment of a furnace for processing a semiconductor wafers, in accordance with some embodiments.

FIG. 6 shows a schematic diagram of one embodiment of a furnace 10a for processing semiconductor wafers 5 in accordance with some embodiments. In the embodiment, elements that are identical with or similar to the elements of the furnace 10 shown in FIG. 1 are designated by the same reference numbers, and the features thereof are not repeated for the purpose of brevity. The difference between the furnace 10 and the furnace 10a includes the gas supplying unit 70 being replaced by a gas supplying unit 70a.

In some embodiments, the gas supplying unit 70a includes a gas tube 72a and an outlet port 73a. The outlet port 73a is connected to the lower portion of the side wall 34 that is adjacent to the bottom side 35. The gas tube 72a is located in the tube 31 and positioned opposite to the outlet port 73a relative to the longitudinal axis Z. The gas tube 72a extends along a direction that is parallel to the longitudinal axis Z from the top side 33 to a position adjacent to the bottom side 35 of the tube 31.

In some embodiments, the gas tube 72a includes a number of injection holes 74a. The injection holes 74a passes through the wall of the gas tube 72a for discharging gas in the gas tube 72a to the reaction chamber 30. The number of injection holes 74a may correspond to the number of slots formed in the columns 53 of the wafer boat 50. For example, each of the columns 53 of the wafer boat 50 has 180 slots for supporting the semiconductor wafers 5, and the gas tube 72a includes 180 injection holes 74a formed thereon.

In some embodiments, a pitch between two neighboring injection holes 74a may be the same of a pitch between two neighboring slots of the wafer boat 50. In addition, a projection of each injection hole 74a along a direction that is perpendicular to the longitudinal axis Z is located on one of the slots of the wafer boat 50. Therefore, gas from the injection holes are discharged into a gap between two neighboring semiconductor wafers 5 loaded on the wafer boat 50.

The gas tube 72a is connected to a gas supply source via an inlet port 71a formed on an upper end thereof which is positioned adjacent to the top side 33 of the tube 31. A controller (not shown in figures) may be connected to the inlet port 71a and be configured to control the connection and delivery rate of the processing material to the reaction chamber 30. The controller may include devices such as valves, flow meters, sensors, and the like.

Figure 7:
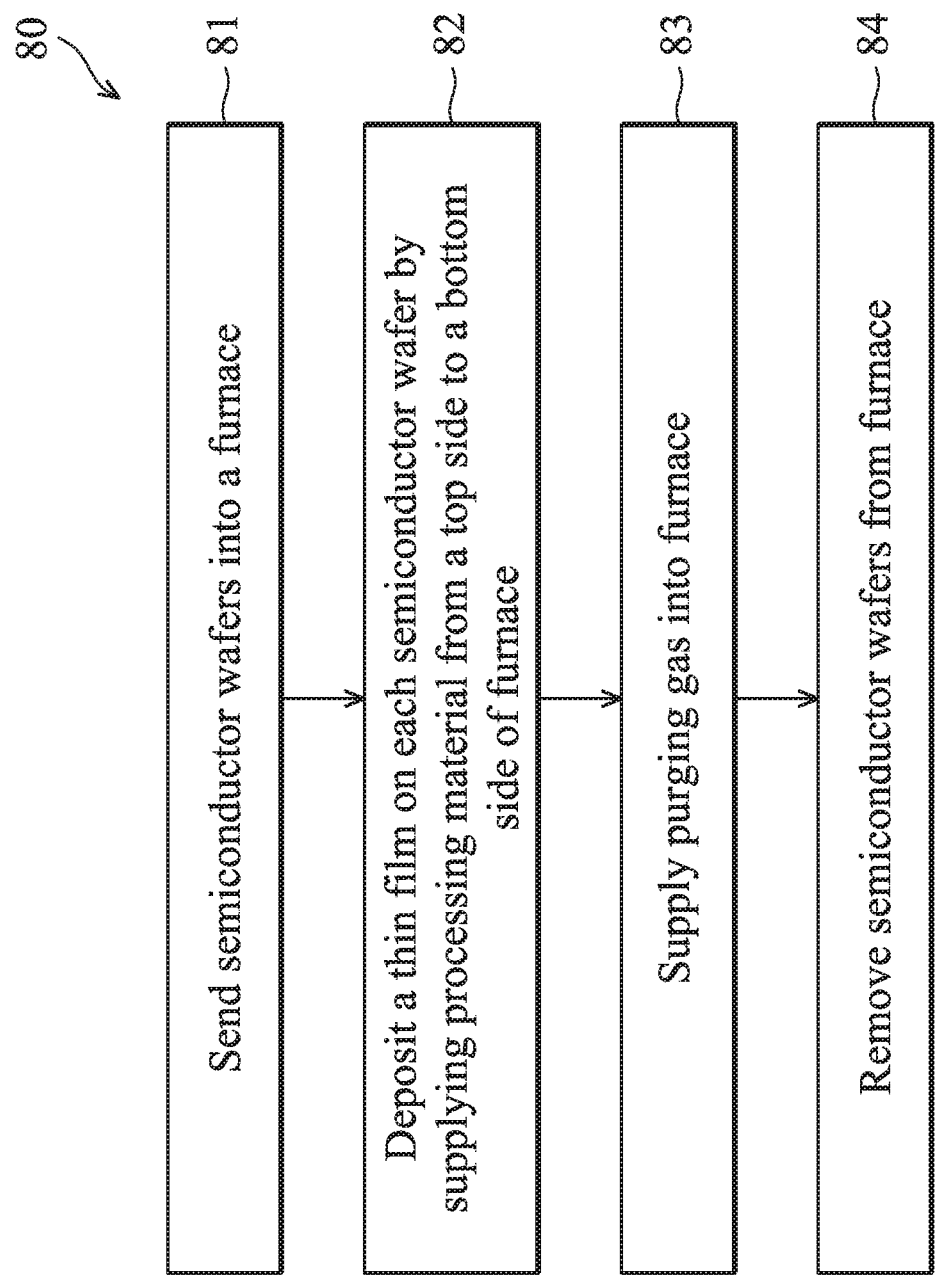
FIG. 7 is a flow chart illustrating a method for processing semiconductor wafers in a furnace, in accordance with some embodiments.

FIG. 7 is a flow chart illustrating a method 80 for processing semiconductor wafers 5 in the furnace 10a, in accordance with some embodiments. For illustration, the flow chart will be described along with the drawings shown in FIGS. 6 and 8-10. Additional operations can be provided before, during, and after the method 80, and some of the operations described can be replaced or eliminated for other embodiments of the method.

The method 80 begins with operation 81, in which semiconductor wafers 5 are sent into the reaction chamber 30 of the furnace 10a. In some embodiments, to load the semiconductor wafers 5 into the wafer boat 50, the sealing lid 32 is separated from the tube 31 by means of the lifting mechanism (not shown in figures), and the insulation cap 40 and the wafer boat 50 are moved outside the cavity defined by the tube 31. The semiconductor wafers 5 may be moved into the wafer boat 50 by a robot arm (not shown in figures) with a blade.

After the semiconductor wafers 5 are loaded to the wafer boat 50, the wafer boat 50 is inserted into the reaction chamber 30. The wafer boat 50 may be loaded in the tube 31 by lifting up the sealing lid 32 by means of the lifting mechanism (not shown in figures). When the sealing lid 32 is connected to the bottom side 35 of the tube 31, the wafer boat 50 is located in a gas-tight reaction chamber 30.

The method 80 continues with operation 82, a thin film of processing material is formed on the semiconductor wafers 5. In some embodiments, the processing material 7 is supplied into the furnace 10a for depositing a thin film 700 (FIG. 3B) of the processing material 7 on each semiconductor wafer 5.

Figure 8:
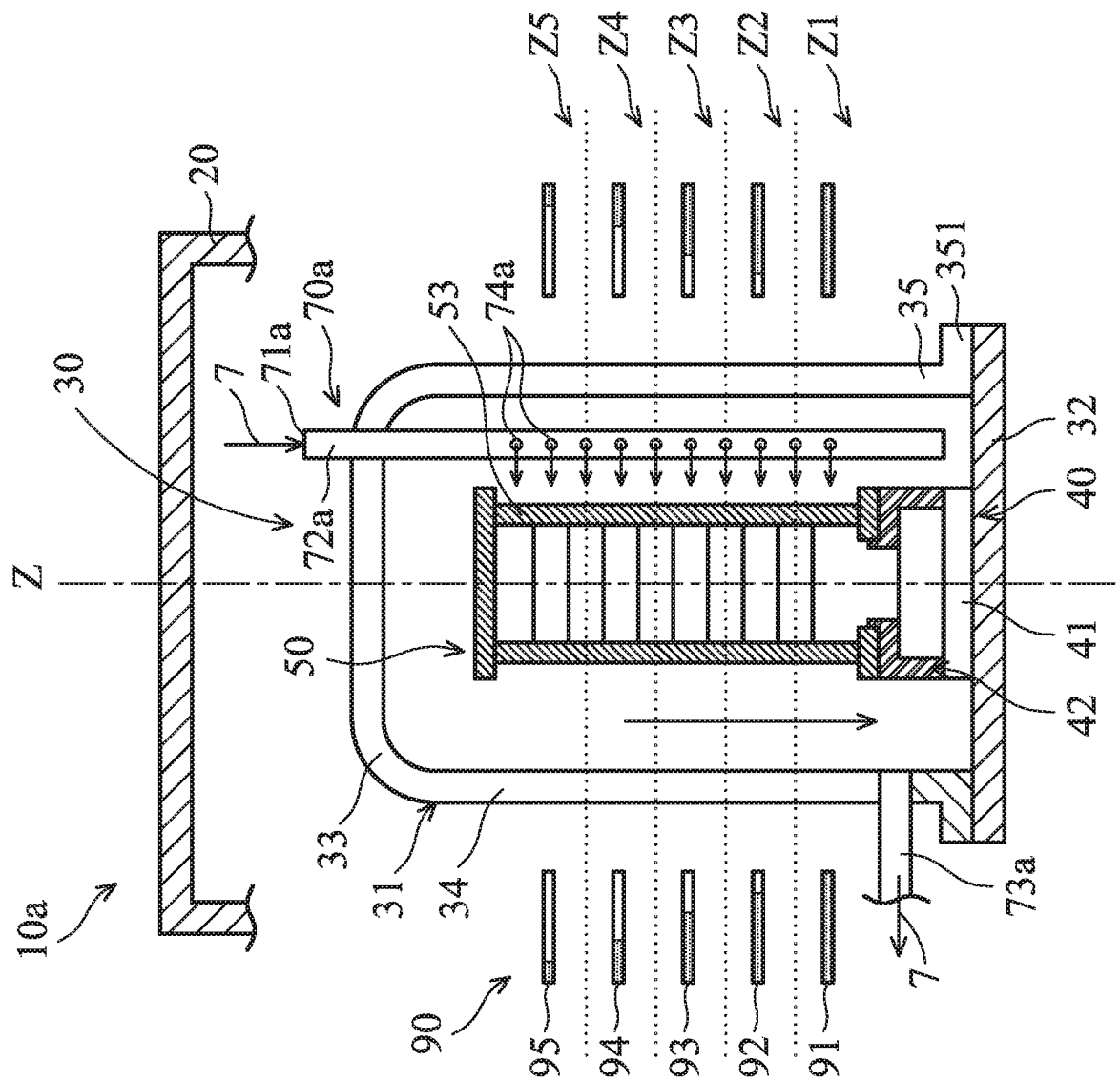
FIG. 8 shows a schematic view of a stage of a method for supplying processing material into a reaction chamber in which heat output from sidewall heaters are gradually increased from a top side to a bottom side of the reaction chamber, in accordance with some embodiments.

The processing material 7 flows from top side 33 to the bottom side 35 of the reaction chamber 30, as indicated by arrows shown in FIG. 8. Specifically, the processing material 7 enters the gas tube 72a via the inlet port 71a and is discharged into the first end thermal zone Z1, the first intermediate thermal zone Z2, the middle thermal zone Z3, the second intermediate thermal zone Z4, the second end thermal zone Z5 via the corresponding injection holes 74a, and is exhausted via the outlet port 73a. The processing material 7 may contain various chemical precursors (e.g. $SiH_2Cl_2$ and $NH_3$ or silane and $NH_3$ to form a silicon nitride film; $Si(OC_2H_5)_4$ to form a TEOS film; and dry oxygen, water vapor or Trans-LC ($C_2H_2Cl_2$) to form oxide layer) that react at the heated semiconductor wafer surface to form a thin film of the desired semiconductor material and thickness thereon.

For purpose of clarity, in the following descriptions of method 80, thermal zone Z1 is referred to as a "second end thermal zone"; thermal zone Z2 is referred to as a "second intermediate thermal zone"; thermal zone Z3 is referred to as a "middle thermal zone"; thermal zone Z4 is referred to as a "first intermediate thermal zone"; and thermal zone Z5 is referred to as a "first end thermal zone".

In some embodiments, operation 82 is performed at an elevated temperature within heated controlled environments by controlling heat output from the sidewall heaters 91-95 so as to enable the second end thermal zone Z1, the second intermediate thermal zone Z2, the middle thermal zone Z3, the first intermediate thermal zone Z4 and the first end thermal zone Z5 to have their predetermined temperatures.

In some embodiments, the sidewall heaters 91, 92, 93, 94 and 95 are controlled in a first thermal mode in which the heat output from the sidewall heaters 91, 92, 93, 94 and 95 are gradually decreased, and as such, temperatures in the second end thermal zone Z1, the second intermediate thermal zone Z2, the middle thermal zone Z3, the first intermediate thermal zone Z4 and the first end thermal zone Z5 are gradually decreased. As a result, semiconductor wafers 5 positioned closer to the bottom side 35 are processed at a higher temperature than the semiconductor wafers 5 positioned closer to the top side 33.

For example, as shown in FIG. 8, heat output from the sidewall heaters 91, 92, 93, 94 and 95 are gradually decreased in a direction away from the bottom side 35 (the larger colored area in the blocks which are designated as the sidewall heaters 91-95 indicates higher heat output from the corresponding sidewall heaters 91-95). Therefore, temperatures in the second end thermal zone Z1, the second intermediate thermal zone Z2, the middle thermal zone Z3, the first intermediate thermal zone Z4 and the first end thermal zone Z5 are gradually decreased in a direction away from the bottom side 35.

In some embodiments, due to the fact that wafer film thickness deposition rates are directly proportional to the processing the temperature, the predetermined temperatures for thin film deposition process in the second end thermal zone Z1, the second intermediate thermal zone Z2, the middle thermal zone Z3, the first intermediate thermal zone Z4 and the first end thermal zone Z5 are controlled based on the concentration of the processing material 7 in the corresponding thermal zone.

Therefore, by heating semiconductor wafers 5 in the first thermal mode during operation 82, an inconsistency in film thicknesses from wafer-to-wafer throughout the entire batch or stack of wafers due to a decrease of the concentration of the processing material 7 along a flow direction (from top side 33 to bottom side 35 in the case shown in FIG. 8) can be mitigated or avoided.

In some embodiments, the second end thermal zone Z1, the second intermediate thermal zone Z2, the middle thermal zone Z3, the first intermediate thermal zone Z4 and the first end thermal zone Z5 are heated to have their predetermined temperatures before the supply of the processing material 7. For example, as shown in FIG. 9, the second end thermal zone Z1 and the first end thermal zone Z5 are respectively heated to an elevated temperature T11 and an elevated temperature T51 before the completion of operation 81 of loading wafer.

Figure 9:
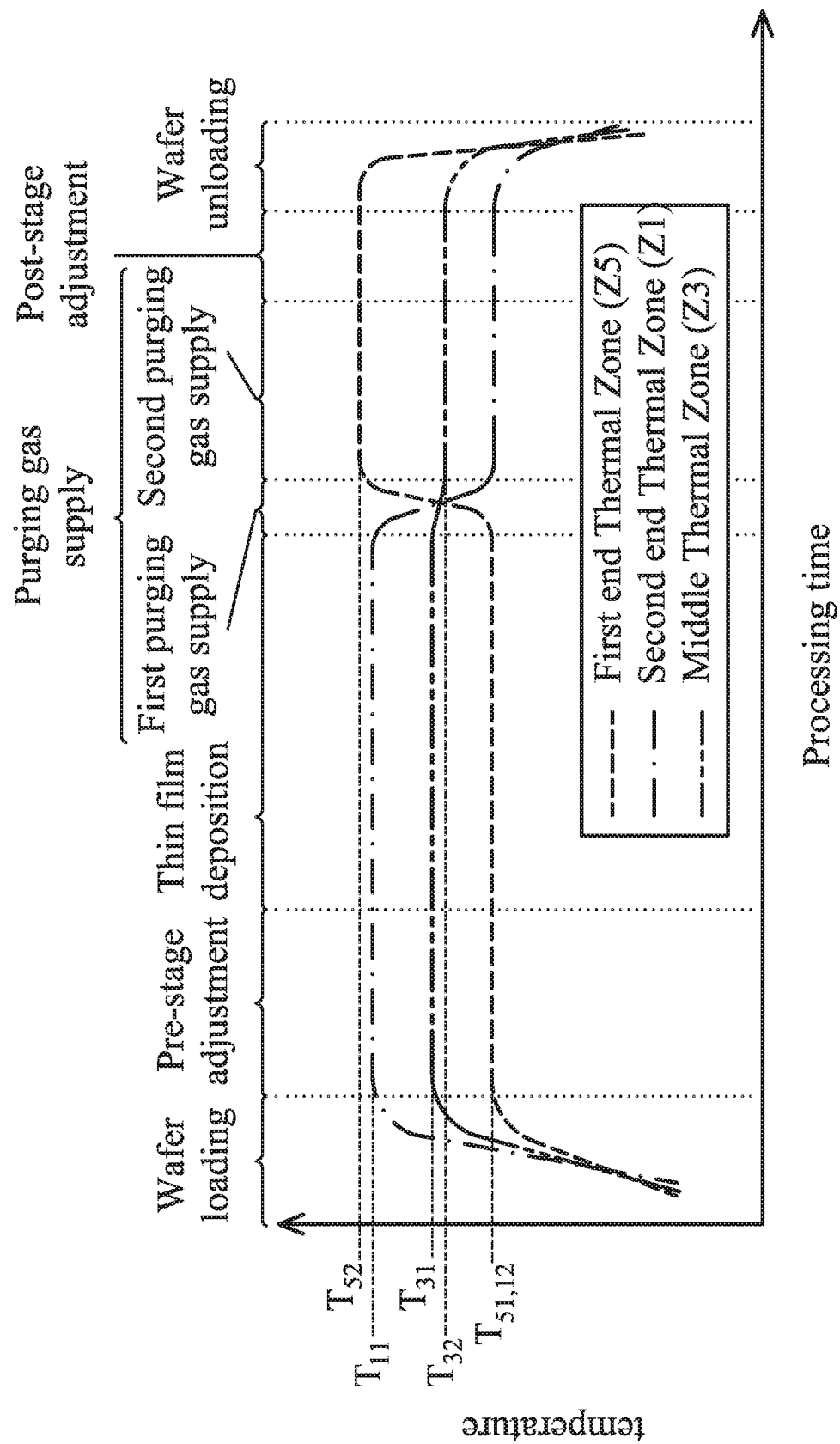
FIG. 9 shows a graph of temperature in the different thermal zones of a furnace versus time in a process for processing semiconductor wafers, in accordance with some embodiments.

In some embodiments, a pre-stage adjustment process is further executed before operation 83 and after operation 81, as shown in FIG. 9. In the pre-stage adjustment process, the thermal zones Z1-Z5 of the reaction chamber 30 are continuously heated so as to allow the heat to be evenly spread in each of the thermal zones. In addition, in the pre-stage adjustment process, the pressure in the reaction chamber 30 is adjusted to a processing pressure at which the deposition process is conducted.

In some embodiments, difference in heat output between the neighboring heaters may be within 5 degrees Celsius. Therefore, in the cases shown in FIG. 8 the temperature difference between the second end thermal zone Z1 and the first end thermal zone Z5 is within twenty (20) degrees Celsius. However, it should be appreciated that many variations and modifications can be made to embodiments of the disclosure. In some other embodiments, temperatures in the thermal zones Z1 and Z2 are the same, and temperature in the thermal zone Z3 is lower than temperatures in the thermal zones Z1 and Z2. In addition, temperatures in the thermal zones Z4 and Z5 are the same and lower than temperature in the thermal zones Z3. The temperature difference between the second end thermal zone Z1 and the first end thermal zone Z5 is within twenty (20) degrees Celsius.

The method 80 continues with operation 83, in which one or more purging gases are supplied into the furnace 10a. In some embodiments, operation 83 is executed after the completion of operation 82 so as to remove the processing material that remains in the reaction chamber 30. In some embodiments, as shown in FIG. 9, operation 83 for supplying purging gas includes supplying a first purging gas into the reaction chamber 30. In addition, operation 83 further includes supplying a second purging gas into the reaction chamber 30. The first purging gas may react with the processing material that remains in the reaction chamber 30, and the second purging gas may remove all the remaining gases including product gas produced during the operation 82. For example, in cases where a silicon nitride film is formed on the semiconductor wafers 5, the first purging gas may include $NH_3$, and the second purging gas may include $N_2$.

In some embodiments, the time period for supplying the first purging gas may be less than the time period for supplying the second purging gas. However, it should be appreciated that many variations and modifications can be made to embodiments of the disclosure. The time period for supplying the first purging gas may be equal to or longer than the time period for supplying the second purging gas.

The method 80 continues with operation 84, in which the semiconductor wafers 5 are unloaded. In some embodiments, to unload the semiconductor wafers 5 from the wafer boat 50, the sealing lid 32 is separated from the tube 31 and the insulation cap 40 and the wafer boat 50 are moved outside the cavity defined by the tube 31. The semiconductor wafers 5 may be removed from the wafer boat 50 by a robot arm (not shown in figures) with a blade.

Operation 84 may be executed after the completion of operation 83. In some embodiments, as shown in FIG. 9, before operation 84 is initiated, the method 80 further includes a post-stage adjustment process. In post-stage adjustment process, the pressure in the reaction chamber 30 may be increased from a vacuum to an ambient pressure.

In some embodiments, after the completion of operation 82 (or during operation 83), heat output from the sidewall heaters 91-95 are changed so as to enable the second end thermal zone Z1, the second intermediate thermal zone Z2, the middle thermal zone Z3, the first intermediate thermal zone Z4 and the first end thermal zone Z5 to have different temperatures from that in operation 82.

In some embodiments, the sidewall heaters 91, 92, 93, 94 and 95 are controlled in a second thermal mode in which the heat output from the sidewall heaters 91, 92, 93, 94 and 95 is gradually increased, and as such, temperatures in the second end thermal zone Z1, the second intermediate thermal zone Z2, the middle thermal zone Z3, the first intermediate thermal zone Z4 and the first end thermal zone Z5 are gradually increased. As a result, semiconductor wafers 5 positioned closer to the top side 33 are processed at a higher temperature than the semiconductor wafers 5 positioned closer to the bottom side 35.

Figure 10:
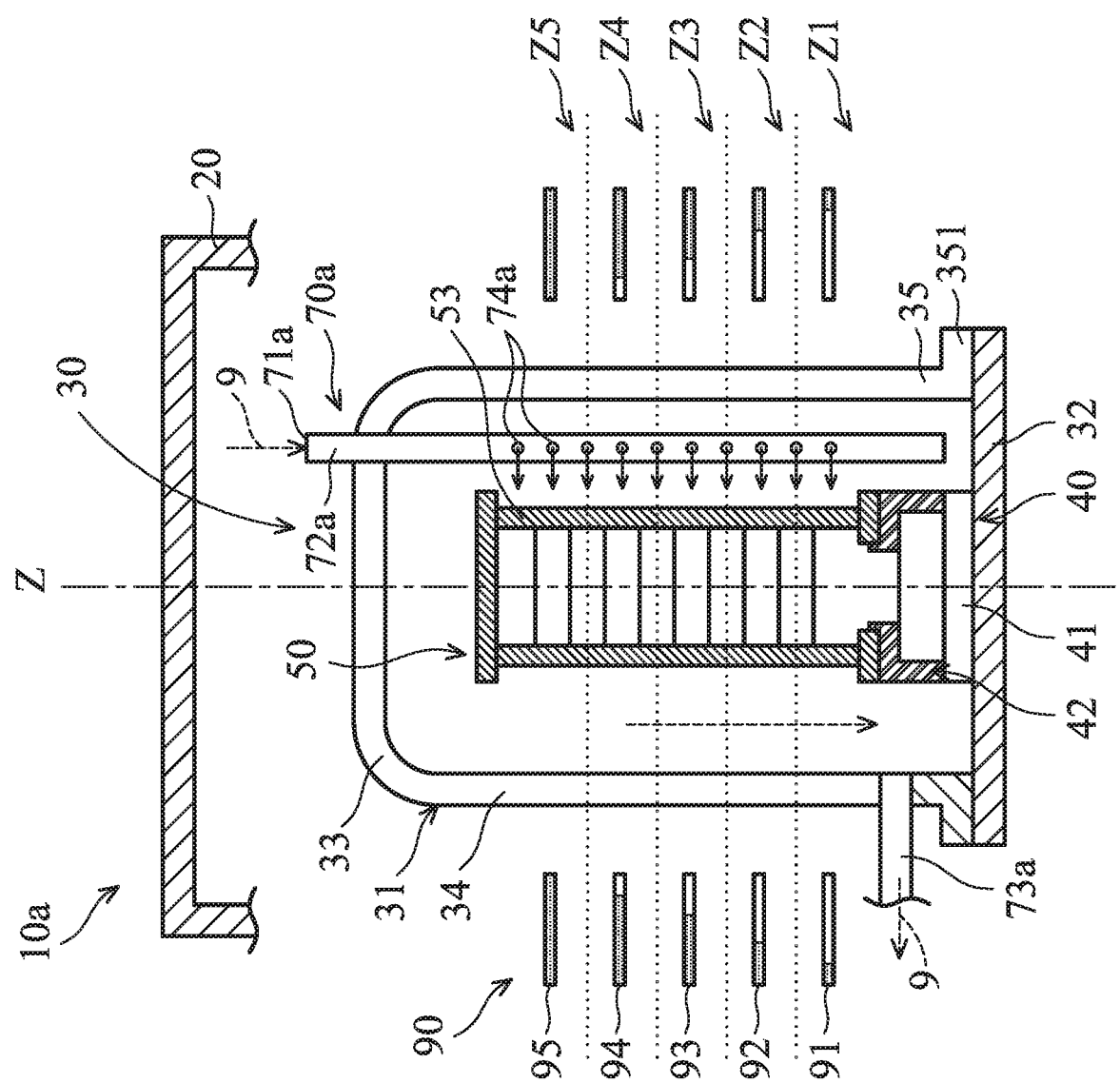
FIG. 10 shows a schematic view of a stage of a method for supplying purging gas into a reaction chamber in which heat output from sidewall heaters are gradually decreased from a top side to a bottom side of the reaction chamber, in accordance with some embodiments.

For example, as shown in FIG. 10, heat output from the sidewall heaters 91, 92, 93, 94 and 95 are gradually increased in a direction away from the bottom side 35. Therefore, temperatures in the second end thermal zone Z1, the second intermediate thermal zone Z2, the middle thermal zone Z3, the first intermediate thermal zone Z4 and the first end thermal zone Z5 are gradually increased in a direction away from the bottom side 35.

Heating semiconductor wafers 5 in the second thermal mode after operation 82 can mitigate or avoid problems that the thin films of processing material which are deposited at different temperatures display different physical properties in the following processing steps (such as a different etch rate in the etching process) due to the temperature variance during operation 82. Accordingly, variations in critical dimension (CD) from wafer-to-wafer after the etching process are minimized. According to experimental results, critical dimension of semiconductor wafers 5 in the first end thermal zone Z1 and the second end thermal zone Z5 are improved 0.3%.

In some embodiments, temperatures in the second end thermal zone Z1, the second intermediate thermal zone Z2, the middle thermal zone Z3, the first intermediate thermal zone Z4 and the first end thermal zone Z5 are changed slowly to prevent thermal stress from being produced in the thin film. In some embodiments, the second end thermal zone Z1, the second intermediate thermal zone Z2, the middle thermal zone Z3, the first intermediate thermal zone Z4 and the first end thermal zone Z5 are heated to have temperatures associated with the second thermal mode within about 4 to 5 minutes.

However, it should be appreciated that many variations and modifications can be made to embodiments of the disclosure. In some other embodiments, the adjustment of the temperatures in second end thermal zone Z1, the second intermediate thermal zone Z2, the middle thermal zone Z3, the first intermediate thermal zone Z4 and the first end thermal zone Z5 is simultaneously performed while the purging gas 9 is supplied into the furnace 10a. The second end thermal zone Z1, the second intermediate thermal zone Z2, the middle thermal zone Z3, the first intermediate thermal zone Z4 and the first end thermal zone Z5 may be heated to have temperatures associated with the second thermal mode before the supply of the first purging gas is completed.

In some embodiments, as shown in FIG. 9, during the transition from the first thermal mode to the second thermal mode, the temperature in the first end thermal zone Z5 is increased until the temperature in the first end thermal zone Z5 is adjusted to temperatures of associated with the second thermal mode. In addition, the temperature in the second end thermal zone Z1 is decreased until the temperature in the second end thermal zone Z1 is adjusted to temperatures associated with the second thermal mode.

In some embodiments, during the transition from the first thermal mode to the second thermal mode, the amount of the temperature reduction in the second end thermal zone Z1 is different from the amount of the temperature increase in the first end thermal zone Z5. For example, the temperature in the second end thermal zone Z1 in the first thermal mode is T11, and temperature in the second end thermal zone Z1 in the second thermal mode is T12. On the other hand, the temperature in the first end thermal zone Z5 in the first thermal mode is T51, and temperature in the first end thermal zone Z5 in the second thermal mode is T52. A temperature difference between T51 and T52 is greater than a temperature difference between T11 and T12. In one exemplary embodiment, temperatures T12 and T51 are about 570° C., temperature T11 is about 590° C., and temperature T52 is about 600° C.

In some embodiments, temperatures in the middle thermal zone Z3 are fixed at the same value in the first thermal mode and the second thermal mode. However, it should be appreciated that many variations and modifications can be made to embodiments of the disclosure. In some other embodiments, temperatures in the middle thermal zone Z3 in the first thermal mode and the second thermal mode are different.

In some embodiments, in both the first and second thermal mode, the temperature in the middle thermal zone Z3 is between the temperatures in the second end thermal zone Z1 and the first end thermal zone Z5. For example, as shown in FIG. 9, in the first thermal mode, the middle thermal zone Z3 is kept at a first temperature T31. The temperature T11 in the second end thermal zone Z1 is higher than the first temperature T31, and the temperature T51 in the first end thermal zone Z5 is lower than the first temperature T31. The first temperature T31 may be a mean value of the temperature T11 in the second end thermal zone Z1 and the temperature T51 in the first end thermal zone Z5 in the first thermal mode.

In addition, in the second thermal mode, the middle thermal zone Z3 is kept at a second temperature T32, the temperature T12 in the second end thermal zone Z1 is lower than the second temperature T32, and the temperature T52 in the first end thermal zone Z5 is higher than the second temperature T32. The second temperature T32 may be a mean value of the temperature T12 in the second end thermal zone Z1 and the temperature T52 in the first end thermal zone Z5 in the second thermal mode.

In some embodiments, the temperature difference in the middle thermal zone Z3 between the first thermal mode and the second thermal mode is smaller than the temperature difference in the second end thermal zone Z1 between the first thermal mode and the second thermal mode. Alternatively, the temperature difference in the middle thermal zone Z3 between the first thermal mode and the second thermal mode is smaller than the temperature difference in the first end thermal zone Z5 between the first thermal mode and the second thermal mode.

Embodiments of methods for processing semiconductor wafers in a furnace independently govern temperatures in thermal zones in the furnace in two stages. During the formation of a thin film, temperatures in the thermal zones are controlled according to the concentration of material for forming the thin films in the corresponding thermal zone. Therefore, uniformity in thin film thicknesses of the deposited thin film from wafer-to-wafer in the stack of semiconductor wafers is improved. After the formation of the thin film, temperatures in the thermal zones are adjusted so that the thin films formed on all semiconductor wafers have substantially the same physical properties. As a result, critical dimension of semiconductor wafers can be well controlled in subsequent manufacturing processes (CD is improved at least 0.3 percent between two end thermal zones according to one experimental result). In addition, die failure rates are decreased in subsequent wafer level and known good die testing (IDU RtR (IDsat uniformity of run to run) is improved 0.6% for NMOS and 0.7% for PMOS according to one experimental result).

In accordance with some embodiments a method for processing semiconductor wafers in a furnace is provided. The method includes forming a thin film on each of the semiconductor wafers in the furnace. The furnace includes a first end thermal zone, a middle thermal zone and a second end thermal zone arranged in sequence. The method further includes controlling the temperature of the furnace in a first thermal mode during the formation of the thin film. The method also includes supplying a purging gas into the furnace after the formation of the thin film. In addition, the method includes controlling the temperature of the furnace in a second thermal mode during the supply of the purging gas. The temperature distributions of the furnace are different in the first and second thermal modes.

In accordance with some embodiments a method for processing semiconductor wafers in a furnace is provided. The method includes forming a thin film on each of the semiconductor wafers in the furnace. The furnace includes a first end thermal zone, a middle thermal zone and a second end thermal zone arranged in sequence. The method also includes controlling the temperature of the furnace in a first thermal mode during the formation of the thin film. In the first thermal mode, the middle thermal zone of the furnace is kept at a first temperature. The temperature in the first end thermal zone is lower than the first temperature, and the temperature in the second end thermal zone is higher than the first temperature. The method further includes supplying a purging gas into the furnace after the formation of the thin film. In addition, the method includes controlling the temperature of the furnace in a second thermal mode after the formation of the thin film. In the second thermal mode, the middle thermal zone of the furnace is kept at a second temperature. The temperature in the first end thermal zone is higher than the second temperature, and the temperature in the second end thermal zone is lower than the second temperature. The adjustment of the temperatures in the first end thermal zone and the second end thermal zone are simultaneously performed while the purging gas is supplied into the furnace. The temperature in the first end thermal zone and the temperature in the second end thermal zone are adjusted to temperatures associated with the second thermal mode before the supply of the purging gas is completed.

In accordance with some embodiments a method for processing semiconductor wafers in a furnace is provided. The method includes supplying a processing material into the furnace via an inlet port. The method also includes exhausting the processing material from the furnace via an outlet port. The furnace comprises a first end thermal zone and a second end thermal zone, and the second end thermal zone is closer to the outlet port than the first end thermal zone. The method further includes stopping the supply of the processing material. During the supply of the processing material, the semiconductor wafers are heated in a first thermal mode in which a temperature in the second end thermal zone is higher than a temperature in the first end thermal zone. After the supply of the processing material is stopped, the semiconductor wafers are heated in a second thermal mode in which the temperature in the second end thermal zone is lower than the temperature in the first end thermal zone. Once the supply of the processing material is stopped, the temperature in the first end thermal zone is increased, and the temperature in the second end thermal zone is decreased until the temperature in the first end thermal zone and the temperature in the second end thermal zone are adjusted to temperatures associated with the second thermal mode.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for processing semiconductor wafers in a furnace, comprising:
    forming a thin film on each of the semiconductor wafers in the furnace comprising a first end thermal zone, a middle thermal zone and a second end thermal zone arranged in sequence, wherein the formation of the thin film comprises supplying a processing material for forming the thin film into the furnace;
    during the formation of the thin film, controlling temperature of the furnace in a first thermal mode;
    after the formation of the thin film, stopping the supply of the processing material and supplying a purging gas into the furnace to remove the processing material that remains in the furnace; and
    during the supply of the purging gas, controlling the temperature of the furnace in a second thermal mode, wherein temperature distributions of the furnace are different in the first and second thermal modes.

2. The method as claimed in claim 1, wherein the first end thermal zone, the middle thermal zone and the second end thermal zone of the furnace have gradually increasing temperature in the first thermal mode;
    wherein the first end thermal zone, the middle thermal zone and the second end thermal zone of the furnace have gradually decreasing temperature in the second thermal mode.

3. The method as claimed in claim 2, wherein once the formation of the thin film is completed, the temperature in the first end thermal zone is increased, and the temperature in the second end thermal zone is decreased until the temperature in the first end thermal zone and the temperature in the second end thermal zone are adjusted to temperatures associated with the second thermal mode.

4. The method as claimed in claim 3, wherein an amount of the temperature increase in the first end thermal zone is different from an amount of the temperature reduction in the second end thermal zone.

5. The method as claimed in claim 3, wherein the adjustment of the temperatures in the first end thermal zone and the second end thermal zone are simultaneously performed while the purging gas is supplied into the furnace.

6. The method as claimed in claim 2, wherein temperatures in the middle thermal zone in the first thermal mode and the second thermal mode are different.

7. The method as claimed in claim 1, wherein after the formation of the thin film, the method further comprises supplying a second purging gas other than the purging gas into the furnace to remove the processing material that remains in the furnace.

8. A method for processing semiconductor wafers in a furnace, comprising:
    forming a thin film on each of the semiconductor wafers in the furnace comprising a first end thermal zone, a middle thermal zone and a second end thermal zone arranged in sequence, wherein the formation of the thin film comprises supplying a processing material for forming the thin film into the furnace;

during the formation of the thin film, controlling the furnace in a first thermal mode in which the middle thermal zone of the furnace is kept at a first temperature, a temperature in the first end thermal zone is lower than the first temperature, and a temperature in the second end thermal zone is higher than the first temperature;

after the formation of the thin film, stopping the supply of the processing material and supplying a purging gas into the furnace to remove the processing material that remains in the furnace; and during the supply of the purging gas, controlling the furnace in a second thermal mode in which the middle thermal zone of the furnace is kept at a second temperature, a temperature in the first end thermal zone is higher than the second temperature, and a temperature in the second end thermal zone is lower than the second temperature;

wherein the adjustment of the temperatures in the first end thermal zone and the second end thermal zone are simultaneously performed while the purging gas is supplied into the furnace;

wherein the temperature in the first end thermal zone and the temperature in the second end thermal zone are adjusted to temperatures associated with the second thermal mode before the supply of the purging gas is completed.

9. The method as claimed in claim 8,
wherein the processing material in the furnace flows through the first end thermal zone, the middle thermal zone and the second end thermal zone in sequence.

10. The method as claimed in claim 8, wherein once the formation of the thin film is completed, the temperature in the first end thermal zone is increased, and the temperature in the second end thermal zone is decreased until the temperature in the first end thermal zone and the temperature in the second end thermal zone are adjusted to temperatures associated with the second thermal mode.

11. The method as claimed in claim 10, wherein an amount of the temperature reduction in the second end thermal zone is different from an amount of the temperature increase in the first end thermal zone.

12. The method as claimed in claim 8, wherein the first temperature is different from the second temperature;
wherein a temperature difference in the middle thermal zone between the first temperature and the second temperature is smaller than a temperature difference in the first end thermal zone between the first thermal mode and the second thermal mode.

13. The method as claimed in claim 8, wherein the first temperature and the second temperature are the same.

14. A method for processing semiconductor wafers in a furnace, comprising:
supplying a processing material into the furnace via an inlet port;
exhausting the processing material from the furnace via an outlet port, wherein the furnace comprises a first end thermal zone and a second end thermal zone, and the second end thermal zone is closer to the outlet port than the first end thermal zone; and
stopping the supply of the processing material;
wherein during the supply of the processing material, the semiconductor wafers are heated in a first thermal mode in which a temperature in the second end thermal zone is higher than a temperature in the first end thermal zone;
wherein after the supply of the processing material is stopped, the semiconductor wafers are heated in a second thermal mode in which a temperature in the second end thermal zone is lower than a temperature in the first end thermal zone;
wherein once the supply of the processing material is stopped, the temperature in the first end thermal zone is increased, and the temperature in the second end thermal zone is decreased until the temperature in the first end thermal zone and the temperature in the second end thermal zone are adjusted to temperatures associated with the second thermal mode.

15. The method as claimed in claim 14, wherein an amount of the temperature reduction in the second end thermal zone is different from an amount of the temperature increase in the first end thermal zone.

16. The method as claimed in claim 14, wherein the furnace further comprises heating the semiconductor wafers in a middle thermal zone of the furnace which is arranged between the first end thermal zone and the second end thermal zone;
wherein temperatures in the middle thermal zone in the first thermal mode and the second thermal mode are different.

17. The method as claimed in claim 16, wherein a temperature difference in the middle thermal zone between the first thermal mode and the second thermal mode is smaller than a temperature difference in the first end thermal zone between the first thermal mode and the second thermal mode.

18. The method as claimed in claim 16, wherein a temperature difference in the middle thermal zone between the first thermal mode and the second thermal mode is smaller than a temperature difference in the second end thermal zone between the first thermal mode and the second thermal mode.

19. The method as claimed in claim 14, wherein the furnace further comprises heating the semiconductor wafers in a middle thermal zone of the furnace which is arranged between the first end thermal zone and the second end thermal zone;
wherein temperatures in the middle thermal zone in the first thermal mode and the second thermal mode are the same.

20. The method as claimed in claim 14, wherein the processing material in the furnace is guided to flow through the inlet port, the first end thermal zone, the second end thermal zone and the outlet port in sequence.

* * * * *